United States Patent [19]

Harrison

[11] Patent Number: 4,488,229

[45] Date of Patent: Dec. 11, 1984

[54] PLA-BASED FINITE STATE MACHINE WITH TWO-LEVEL CONTROL TIMING AND SAME-CYCLE DECISION-MAKING CAPABILITY

[75] Inventor: Marc L. Harrison, Morganville, N.J.

[73] Assignee: AT&T Bell Laboratories, Murray Hill, N.J.

[21] Appl. No.: 448,001

[22] Filed: Dec. 8, 1982

[51] Int. Cl.³ .............................................. G06F 9/22
[52] U.S. Cl. ................................... 364/200; 364/716;
307/465; 340/825.83
[58] Field of Search ... 364/200 MS File, 900 MS File,
364/716, 715; 340/825.79, 825.83, 825.85,
825.86, 825.87; 307/465, 466, 467, 468, 469, 463

[56] References Cited

U.S. PATENT DOCUMENTS

| | | | |
|---|---|---|---|
| 3,593,289 | 7/1971 | Lerch et al. | 340/825.83 |
| 3,974,366 | 8/1976 | Hebenstreit | 364/716 |
| 4,032,894 | 6/1977 | Williams | 340/825.83 |
| 4,034,356 | 7/1977 | Howley et al. | 307/465 |
| 4,124,899 | 11/1978 | Birkner et al. | 364/716 |
| 4,399,516 | 8/1983 | Blahut et al. | 364/716 |
| 4,409,499 | 10/1983 | Zapisek et al. | 364/716 |
| 4,415,818 | 11/1983 | Ogawa et al. | 340/825.83 |
| 4,429,238 | 1/1984 | Harrison | 307/465 |

OTHER PUBLICATIONS

E. Hebenstreit et al., "High-Speed Programmable Logic Arrays in ESFI SOS Technology," *IEEE Journal of Solid-State Circuits*, vol. SC-11, No. 3, Jun. 1976, pp. 370-374, (FIG. 3).
C. Mead et al., *Introduction to VLSI Systems*, 1980, pp. 75-84.
"PLA Test Enhancement", by Logue et al., IBM Tech. Discl. Bull., vol. 23, No. 3, Aug. 1980, pp. 1116-1117.
"PLA Else Clause Implementation" by Kraft et al., IBM Tech. Discl. Bull., vol. 25, No. 12, May 1983, p. 6502.
"Clocked PLA w/Dummy Circuit Forming Clock Pulse for Inter-Array Driver w/Worst-Case Delay" by Kluga, IBM T.D.B., vol. 24, No. 6, Nov. 1981.
"Programmable Logic Array Decoding Technique" by Howley et al., IBM Tech. Discl. Bull., vol. 17, No. 10, Mar. 1975, p. 2988.

*Primary Examiner*—Raulfe B. Zache
*Assistant Examiner*—William G. Niessen
*Attorney, Agent, or Firm*—David I. Caplan

[57] ABSTRACT

A PLA (e.g., 100) operates with two-level clock control timing, that is, with a pair of master and slave registers (e.g., 12 and 13) connected to the PLA wordlines (e.g., $W_1, W_2, \ldots W_n$) between the PLA's AND and OR planes (e.g., 11 and 14). The slave register's output to the OR plane is controlled by a combinational logic device (e.g., 21), such as an AND gate to which a WAIT signal is applied. In this way, when the WAIT signal (e.g., W) is available at the beginning of a given cycle of the clock control timing, the output of the PLA (including PLA feedback) can respond to this WAIT signal before the end of the given cycle—that is, the PLA is capable of same-cycle decision making.

19 Claims, 4 Drawing Figures 4,488,229

PLA-BASED FINITE STATE MACHINE WITH TWO-LEVEL CONTROL TIMING AND SAME-CYCLE DECISION-MAKING CAPABILITY

FIELD OF THE INVENTION

This invention relates to data processing systems and more particularly to programmed logic arrays (PLAs).

BACKGROUND OF THE INVENTION

Logic arrays are used in digital data processing systems to perform logic calculations or transformations; that is, to process data by furnishing data signal outputs which are determined by data signal inputs in accordance with prescribed logic transformation rules. For this purpose, programmed logic arrays (PLAs) provide an easily designed and well-structured alternative to random (individually distributed) combinatorial (or "combinational") logic devices. The advantages of a PLA stem from its compact integrated circuit layout and its ease of systematic design once the desired logic transformation rule or function (output vs. input) or "characteristic table" is prescribed. Also, because of a PLA's patterned array structure, redefinition of its logical transformation function can be as easily accomplished as modification of a conventional ROM (Read Only Memory) array, i.e., by modification of the pattern of array crosspoints at which cross-connection elements are present vs. absent.

Internally, a conventional PLA comprises two logic array portions known as the AND plane (also known as the DECODER array portion) and the OR plane (also known as the ROM array portion). The AND and OR planes are electrically connected together by paths or lines known as interconnecting (or intermediate) wordlines, say n in number. During operation, a sequence of PLA binary input data signal combinations is entered into the AND plane on a plurality of input lines, say N in number, in order to furnish a sequence of binary input combinations or input words—for example, each word formed by a binary bit string, such as (1,0,1 ... 0,1,0), of binary digital bits, N in number—and a sequence of PLA binary output data signals or output words emanates in response thereto from the OR plane on a plurality of output lines, say P in number. When the PLA is adapted for use as a finite state machine, one or (typically) more of the binary output signals from the OR plane can be fed back as input bits to the AND plane. Both AND and OR planes, in certain specific embodiments, comprise orthogonal row and column lines mutually intersecting at crosspoints; and at each of the crosspoints is situated or is not situated a crosspoint connecting link such as a transistor, depending upon the desired logic tranformation function of the PLA.

The binary signal on a line carrying data in the PLA can be either logic HIGH, representing the binary digital bit ONE ("1"), or else logic LOW, representing the binary digital bit ZERO ("0"). Ordinarily, any given intermediate wordline (between AND and OR planes) will be logic HIGH (binary ONE or 1) if and only if the input word introduced on the input lines of the AND plane is a member of a set of given input words corresponding to that wordline. In a specific example, for purpose of illustration, the given intermediate wordline will be logic HIGH if and only if the input word is the bit string characterized by the first bit ($I_1$) being logic HIGH ($I_1 = 1$), and the second bit ($I_2$) being logic LOW ($I_2 = 0$), and the third bit ($I_3$) being logic HIGH ($I_3 = 1$), ... and the last bit ($I_N$) being logic LOW; that is, if and only if $I_1 = 1$ and $I_2 = 0$ and $I_3 = 1$ ... and $I_N = 0$ (where N is the number of bits in the input word and hence $I_N$ is the last (N'th) bit). On the other hand, the output signal on a given output line (a given output bit) emanating from the OR plane is logic LOW if and only if any one or more of a given group of intermediate wordlines is logic HIGH, that is, for a specific example, if and only if the first wordline ($W_1$) is logic HIGH, or the third wordline ($W_3$) is logic HIGH, or the sixth wordline ($W_6$) is logic HIGH; that is, the given output bit is ZERO when and only when $W_1 = 1$ or $W_3 = 1$ or $W_6 = 1$. In this way, the PLA supplies output words which are (Boolean) functions of the input words.

In ordinary operation with a PLA, it is desired that the PLA should handle many input words in sequence, one input word after another; that is, the PLA should perform its prescribed transformation on many words of input data, one input word after another, and should deliver its corresponding output words in sequence, one output word after another. Accordingly, the PLA is supplied with data shifting means (shift registers) for repetitively temporarily storing and shifting (transferring) data into, through, and out of, the PLA—all in accordance with a suitable timing sequence, so as to avoid confusion of one word or set of data (say, old data) with another (say, new data) in the PLA. Moreover, the PLA must be able to receive each new input word and to deliver each new output word at appropriate respective moments of time or during appropriate time intervals, according to the system requirements of the rest of the data processing system in which the PLA operates. Such system requirements typically are "synchronous"; that is, the PLA receives data from and delivers data to the rest of the system in response to (periodic) clock control timing, typically in the form of a sequence of clock pulses. In such a case, the PLA can receive input data only during a first predetermined portion or phase of each cycle (period) of the clock control, and the PLA can deliver output data only during a second predetermined (in general, different) portion or phase of each such cycle of the clock. For example, if the clock has two phases ($\phi_1$, $\phi_2$) per cycle, then the PLA typically receives input data during one of the phases ($\phi_1$) and delivers output data during the other of the phases ($\phi_2$) of each cycle. Accordingly, the rate at which the PLA processes (receives and delivers) data is inversely proportional to the clock cycle time or period T of the control clock and is directly proportional to the clock frequency $f = 1/T$.

The data shifting means required in a PLA ordinarily takes the form of a pair of clocked parallel registers for temporarily storing periodically shifting data. Each register typically takes the form of a group of flip-flop devices (each device being a pair of crosscoupled inverters), the output of one being the input of the other) mutually arranged in parallel, that is, so that each entire binary word being processed by the PLA can be transferred (shifted) into, temporarily stored in, and transferred out of the register—all in reqponse to a single clock cycle of the control timing supplied to the registers. The pair of registers is ordinarily connected and supplied with control timing so as to operate in a "master-slave" relationship, that is, one of the registers serving as the "master" register and the other as its "slave." By definition, the master receives data from an external source (such as another register) and its slave receives data from its master, all in response to control timing arranged so that when one of the registers (master or slave) can receive new data the other cannot.

Thus, for example, during a first phase of a cycle of the clock used to control the timing of both master and slave, data can enter into the master register but not into its slave, and during a second phase of the control cycle, data is shifted (entered) from the master into its slave register but then no data can enter into the master.

The U.S. patent application Ser. No. 448,002, filed on Dec. 8, 1982, entitled "Programmed Logic Array With Two-Level Control Timing" (M. E. Thierbach 6), teaches that a PLA can operate at a faster rate of speed than in prior art (or can be built of larger size, and hence larger data handling capacity, and operate at the same rate) by inserting a pair of parallel registers in master-slave relationship on the intermediate wordline between the AND and OR planes of the PLA. The PLA then operates with two-level control timing; that is, data circulate through the PLA in two cycles of the control timing used to control the registers, rather than in one cycle as in prior art. On the other hand, although the PLA can then operate to yield output data at the faster rate, the time required for data to circulate through the PLA does not correspondingly decrease but remains essentially the same because it takes the two cycles of control timing for data to circulate through the PLA operating with two-level control timing.

U.S. Pat. No. 4,399,516 issued to D. E. Blahut et al on Aug. 16, 1983 entitled "Stored Program Control Machine," teaches that advantage can be gained when an input signal for an input register of a PLA is gated by a combinational logic device (such as an AND gate) with a WAIT signal. That is, for example, a HIGH level of input signal cannot be latched by the input register when the WAIT signal goes LOW ("unready"). When single-level control timing of the PLA registers is used as described in the aforementioned Blahut et al application, that is, when data circulate through the PLA in one cycle, then, if the WAIT signal goes "unready" at the beginning of a given clock cycle, the "unready" signal affects the output of the PLA at the end of the (same) given cycle. However, when a PLA operates with two-level control timing in accordance with the above-mentioned Thierbach application, then the "unready" signal affects the output of the PLA at the end of the next cycle (after the given cycle) but does not affect the output of the PLA at the end of the (same) given cycle. Thus a delay or time lag of a full cycle occurs before the "unready" signal affects the output of the PLA operating with two-level control timing. Accordingly, the output of the PLA in a given cycle cannot respond in a given cycle to a WAIT signal available for the PLA in the same cycle, but only to a WAIT signal available in the previous cycle. In other words, the PLA lacks a desirable same-cycle decision-making capability in response to the WAIT signal.

The U.S. patent application Ser. No. 446,343, filed on Dec. 2, 1982, entitled "PLA-Based Finite State Machine With Combinational Logic Control of Input Register Thereof" (M. L. Harrison et al.), teaches that in certain cases the size of a PLA implementing a finite state machine (i.e., with feedback from output to input of the PLA) can be reduced, and hence its speed of operation can be increased, by inserting a combinational logic device (such as an AND gate) to gate or stop the clock control timing of the input register of the AND plane of a PLA in response to an "unready" level of a WAIT signal applied to an input terminal of the logic device. Such cases arise where it is desired that the feedback state of the PLA should remain the same (should be "frozen"), because the rest of the system is not ready to supply new input data to the PLA or to utilize new output data from the PLA. Thus, for example, if at the commencement of a given cycle of single-level control timing (data circulate through the PLA in one cycle), the WAIT signal goes "unready", then the state of the machine of the previous cycle persists without change throughout the given cycle: that is, the machine is frozen beginning with the same cycle at the beginning of which the "unready" signal is available. However, when a PLA operates with two-level control timing in accordance with the above-mentioned Thierbach application, then the state of the machine will not be frozen beginning with the same cycle. Instead, when an "unready" signal is applied at the beginning of a given cycle, then the state of the machine as of the next (future) cycle will be frozen--that is, the state of the machine (at the end) of the present cycle will in general be different from that (at the end) of the previous cycle, and only the state of the next cycle (as well as of still later cycles if the "unready" signal persists) will be the same as that of the present cycle. Thus, a delay or time lag of a full cycle occurs after commencement of the "unready" signal before the machine is frozen. Such a lag constitutes an undesirable delay in those cases where the "unready" signal signifies present unreadiness, for example, present unavailability of input to the PLA from the rest of the system. The PLA thus lacks a desirable same-cycle decision-making capability with respect to freezing in response to the WAIT signal. It would therefore also be desirable to have a means for freezing without delay a PLA implementing a finite state machine using two-level control timing, that is, for freezing the PLA feedback state during the same cycle in which the "unready" signal is available for application to the PLA.

SUMMARY OF THE INVENTION

This invention involves a PLA with two-level clock control timing having single-cycle (or "one-cycle") decision-making capability in response to a WAIT signal. Typically, when the WAIT signal goes LOW ("unready") at the beginning of a clock cycle of the control timing, then the output of the PLA (including feedback) is affected thereby during the same clock cycle. In order to accomplish this single-cycle decision-making capability, the WAIT signal is applied directly to control a flow of output data from a slave register of a pair of registers in master-slave relationship connected on the wordlines between AND and OR planes of the PLA. In this way, the slave register receives its wordline input data from its master register and delivers its wordline output data to the OR plane under the control of the WAIT signal, while a PLA output register delivers PLA output data which can be affected by the WAIT signal within the same clock cycle as that during which the WAIT signal is available.

For example, in order for a PLA implementing a finite state machine with two-level control timing to be capable of being frozen without any delay, that is, as soon as (i.e., within the same cycle) an "unready" signal is available, the control timing for a slave register, in the master-slave register pair connected on the wordlines between AND and OR planes of the PLA, is gated by a combinational logic device. The combinational logic device can take the form of an AND gate whose inputs include the (ungated) clock control timing for the slave register and the WAIT signal, the WAIT signal being LOW ("unready") when the PLA is to be frozen and being HIGH otherwise.

In a specific embodiment of the invention a PLA which implements a finite state machine includes an AND plane and an OR plane with intermediate wordlines therebetween. A pair of parallel registers in master-slave relationship is connected on the wordlines in order to receive data from the AND plane and deliver data to the OR plane an input parallel register is connected to the AND plane's input end in order to deliver data to the AND plane, and an output parallel register is connected to the OR plane's output end in order to receive data from the OR plane. The output register is also connected to deliver data to other portions of a data processing system in which the PLA operates, as well as to deliver data to the input register. The input register is also connected to receive data from still aother portions of the system, as well as from the output register. The input register, the output register, and the pair of registers in master-slave relationship connected on the wordlines are all controlled as to timing by two-level periodic control timing, except that the control timing for the slave register of the pair of registers connected on the wordlines is not periodic but instead is derived from an output terminal of an AND gate. An input terminal of the AND gate is connected to receive a periodic clock pulse sequence. Another input terminal of the AND gate is connected to a WAIT signal line which delivers a LOW level ("unready") signal when the PLA is to be frozen and a HIGH level ("ready") signal otherwise. The output terminal of this AND gate is connected to the slave register, in order to supply it with gated control timing—and thereby directly to control a flow of data into the slave register, and hence to control the flow of data from the OR plane to the AND plane—in a manner suitable for freezing the PLA within the same cycle as that cycle at the commencement of which the "unready" signal is applied.

In another specific embodiment, the AND gate is connected as follows: one input terminal thereof to receive output of the slave register, another input terminal to receive the WAIT signal, and an output terminal thereof to a wordline emanating from the slave register and entering the OR plane of the PLA. In this way, the AND gate directly controls the flow of data on the wordline from the slave register to the OR plane in such a manner that the PLA output can respond to (can be affected by) the WAIT signal within the same cycle as that during which the "unready" signal is applied.

BRIEF DESCRIPTION OF THE DRAWINGS

This invention together with its advantages, features, and objects may be better understood from the following detailed description in which.

DETAILED DESCRIPTION

Figure 1:
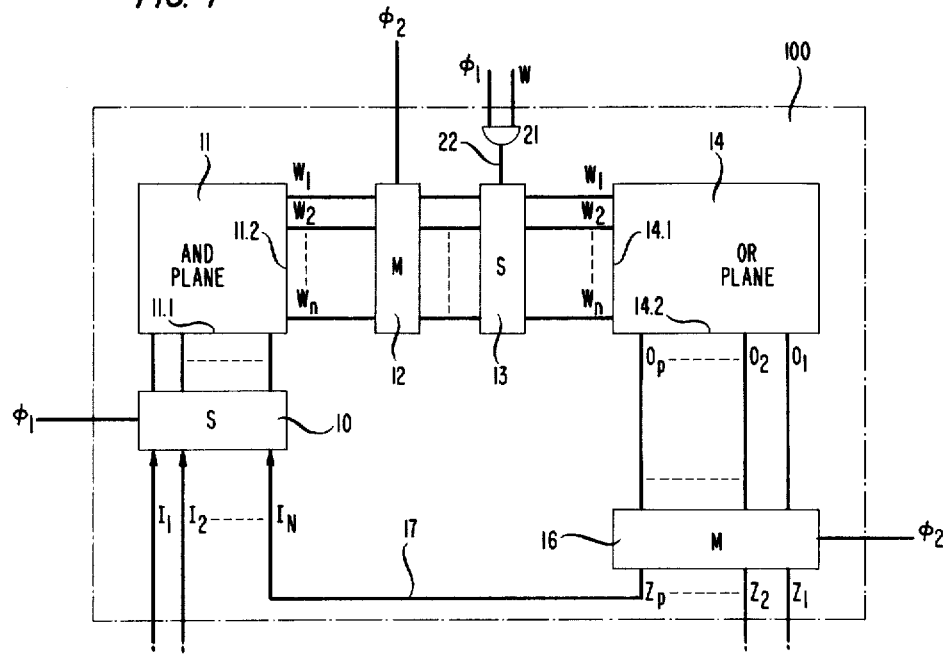
FIG. 1 is a diagram of a PLA, implementing a finite state machine, with two-level control timing in accordance with a specific embodiment of the invention.

Referring to FIG. 1, a PLA 100 includes an input register 10, an AND plane 11, intermediate wordlines $W_1, W_2, \ldots W_n$, a master register 12 and a slave register 13 connected on these wordlines, an OR plane 14 with output lines $O_1, O_2, \ldots O_p$, and an output register 16. Each register typically comprises an array of clock controlled transmission gates for periodically delivering incoming data to an array of latches, as more fully described below. The output register 16 has output lines $Z_1, Z_2, \ldots Z_p$. The input register 10 has input lines $I_1, I_2, \ldots I_N$. At least one output line $Z_p$ is connected by a feedback line 17 to an input line $I_n$ in order to implement a finite state machine.

Figure 2:
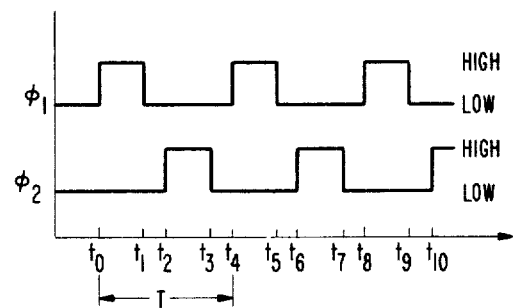
FIG. 2 is a diagram of control timing useful in the embodiment of FIG. 1.

Control timing for the input register 10 is supplied by a first clock pulse sequence $\phi_1$. Control timing for the master register 12, as well as for the output register 16, is supplied by a second clock pulse sequence $\phi_2$. Both sequences $\phi_1$ and $\phi_2$ are described in greater detail below in conjunction with FIG. 2. Control timing for the slave register 13 is supplied by a control line 22 connected to the output terminal of an AND gate 21. The output of the AND gate is HIGH if and only if both of its inputs are HIGH. The AND gate 21 has an input terminal supplied with the first clock sequence $\phi_1$ and another input terminal supplied with a WAIT signal W. The WAIT signal W is HIGH ("ready") when it is desired that the PLA 100 should operate normally, that is, should progress from one state to the next during each clock cycle period T (FIG. 2). The WAIT signal W is LOW ("unready") when it is desired that the state of the PLA 100 should be frozen, that is, should remain in the same state for more than one cycle and for as long thereafter as the WAIT signal W remains LOW. The "unready" signal level of the WAIT signal W thus stops the reception by the slave register 13 of any data (from the wordlines), until the "ready" level of the WAIT signal resumes.

The input register 10 is connected to receive and latch data from the input lines $I_1, I_2, \ldots I_N$ in response to control timing or clocking supplied by a first periodic clock pulse sequence $\phi_1$, of periodicity T, comprising alternating HIGH and LOW levels (pulses), as indicated in FIG. 2 for example. During time intervals corresponding to the HIGH levels or phases ($t_0t_1, t_4t_5, t_8t_9, \ldots$), the input register is transparent to its input data; during time intervals corresponding to the LOW phase ($t_1t_4, t_5t_8, \ldots$), the input register latches these data. By "transparent" is meant that the latches (not shown) in the register can then receive fresh (new) data flowing (incoming) to the register. The input register 10 delivers its output data to the AND plane 11 along N input lines to the input side 11.1 thereof. Thus the input register 10 typically is formed by a parallel shift register having N parallel stages and one serial stage, each such stage comprising a $\phi_1$ clock controlled transmission gate for periodically delivering (incoming) data to a latch.

The AND plane 11 is essentially a crosspoint array of horizontal lines, n in number, and vertical lines, N in number. The AND plane 11 is connected to receive data at its input side (or input end) 11.1 emanating along N vertical lines from the input register 10, and to deliver data (as transformed by the AND plane) to the intermediate wordlines $W_1, W_2, \ldots W_n$. At each crosspoint of the AND plane is connected or is not connected an operative link such as a transistor, depending upon the desired tranformation function of this AND plane, as described in greater detail, for example, in the book by C. Mead et al entitled *Introduction to VLSI Systems*, at pages 81-82 (1980), or in the paper by E. Hebenstreit et al entitled "High-Speed Programmable Logic Arrays in ESFI SOS Technology," published in *IEEE Journal of Solid-State Circuits*, Vol. SC-11, pages 370-374 (1976).

The master register 12 is connected to receive and latch data from the intermediate wordlines $W_1, W_2, \ldots W_n$ emanating from an output side (or output end) 11.2 of the AND plane 11. The master register 12 can latch these data in response to control timing supplied by a second clock pulse sequence $\phi_2$, also of periodicity T, comprising alternating HIGH and LOW levels (pulses), as indicated in FIG. 2 for example. During time intervals corresponding to HIGH levels or phases ($t_2t_3$, $t_6t_7$, ...) of the second clock pulse sequence $\phi_2$, the master register 12 is transparent to its (wordline) input (incoming) data; during the LOW levels of $\phi_2$, the master register 12 latches these data. Thus the master register 12 typically is formed by a parallel shift register having n parallel stages and one serial stage.

The slave register 13 is connected to receive and latch data from its master register 12. The slave register 13 can latch these (wordline input) data in response to control timing supplied by an AND gate 21 on control line 22 connected to the output terminal of such AND gate. During time intervals when this control line 22 is HIGH, the slave register 13 is transparent to data (from its master); when the control line 22 is LOW, the slave register 13 latches the data. Thus the slave register 13 typically is formed by a parallel shift register having n parallel stages.

Advantageously, the slave register 13 is a static register, that is, each of its stages includes (in addition to a transmission gate) a static latch which can store data for many cycles T, that is, for at least as many cycles T as the longest duration of time during which the WAIT signal W (and hence the control line 22) remains LOW during operation. In this way, when the WAIT signal remains LOW for many cycles, and hence when the state of the PLA 100 is to be frozen for many cycles, data is not lost.

The slave register 13 is connected to deliver its (wordline) output data along wordlines $W_1, W_2, \ldots W_n$ into the input side or end 14.1 of the OR plane 14. Thus, the WAIT signal W directly controls the flow of data into the slave register 13 and thereby controls the flow of data from the AND plane 11, through the master and slave registers 12 and 13, to the OR plane 14 along the wordlines $W_1, W_2, \ldots W_n$.

The OR plane 14 is constructed similarly to the AND plane 11, except that the OR plane has n horizontal lines and P vertical lines. The OR plane has each of its crosspoints supplied, or not supplied, with an operative link such as an operative transistor, depending upon the desired transformation function of the OR plane, as described in greater detail in the aforementioned book by C. Mead or the aforementioned paper by E. Hebenstreit.

The output register 16 is connected to received and latch data emanating along P (vertical) output lines $O_1$, $O_2, \ldots O_p$ from the OR plane 14. The output register 16 can latch these data in response to control timing supplied by the second clock pulse sequence $\phi_2$, that is, according to the same timing as that of the master register 12. Thus, the output register 16 can latch data (from the OR plane 14) only during the same time intervals during which the master register 12 can latch data from the AND plane 11. Thus the output register 16 typically is formed by a parallel register having P parallel stages and one serial stage.

The output register 16 can continuously deliver its PLA output data signals along output lines $Z_1, Z_2, \ldots Z_p$, and one or more of these output signals become input for the input register 10 by virtue of feedback path(s). Feedback line 17, for example, supplies a feedback path for output signal $Z_p$ which becomes input signal $I_N$. Such a feedback path enables the PLA 100 to implement a finite state machine. Typically, there is more than one such feedback path.

During operation, the input register 10 is transparent to data from input lines $I_1, I_2, \ldots I_n$ during those phases or time intervals when the first clock sequence $\phi_1$, is HIGH such as ($t_0t_1$). These data are transformed by the AND plane 11 and periodically received by the latches in the master register 12 during subsequent phases or time intervals when the second clock sequence $\phi_2$ is HIGH (such as $t_2t_3$). Next, these data are received by the latches in the slave register 13 from the master register 12 during HIGH phases of the first clock sequence $\phi_1$ (such as $t_0t_1$ and $t_4t_5$) only if the WAIT signal W is then HIGH; otherwise the latches in the slave register 13 retain old data received from the master register 12 during a previous cycle. The data from the slave register are transformed by the OR plane and are periodically received by the latches in the output register 16 during subsequent time intervals when the second sequence $\phi_2$ is HIGH (such as $t_6t_7$). Some of the data from the output register 16 are fed back to and received by the latches in the input register 10 on one or more feedback lines during all subsequent time intervals when the first sequence $\phi_1$ is HIGH (such as $t_4t_5$ and $t_8t_9$). Thus, if the LOW or "unready" level of the WAIT signal W is applied to the AND gate 21 at the commencement of the "present" cycle, say $t_4t_8$, then the latches in the slave register 13 (substantially immediately) cannot receive any new data during this same cycle $t_4t_8$ (assuming the "unready" level persists throughout $t_4t_5$). Therefore, the slave register 13 continues to deliver the same data to the OR plane 14 during the present cycle $t_4t_8$ as it did during the previous cycle $t_0t_4$. Accordingly, the output register 16 receives the same data during the HIGH phase ($t_6t_7$) of the second clock sequence $\phi_2$ during the present cycle as it did during the HIGH phase ($t_2t_3$) thereof during the previous cycle. Thus, in particular, the output register 16 delivers the same feedback during a later portion of the present cycle (beginning at $t_6$, and thereafter continuing at least until $t_{10}$) as it did during a later portion (beginning at $t_2$) of the previous cycle $t_0t_4$ (and continuing through the earlier portion $t_4t_6$ of the present cycle $t_4t_8$), as is desired.

It should be understood that in certain cases the safety margin against a "race-through" (premature shifting of data by registers) condition—as is afforded by nonvanishing time intervals $t_1t_2$, $t_3t_4$, $t_5t_6$, $t_7t_8 \ldots$ (when both sequences $\phi_1$ and $\phi_2$ are LOW)—is not required, for example, because of suitable selection of threshold levels of transistors used as transmission gates for the registers. In such cases, the safety margin can be reduced to zero, and thus the clock sequences $\phi_1$ and $\phi_2$ can be reduced to $\phi$ and $\bar{\phi}$, i.e., complementary clock pulse sequences each having HIGH and LOW phases of equal duration.

The input register 10, the master register 12, and the output register 16 can each be formed by static or by dynamic parallel stages, depending upon the system parameters and requirements.

Figure 3:
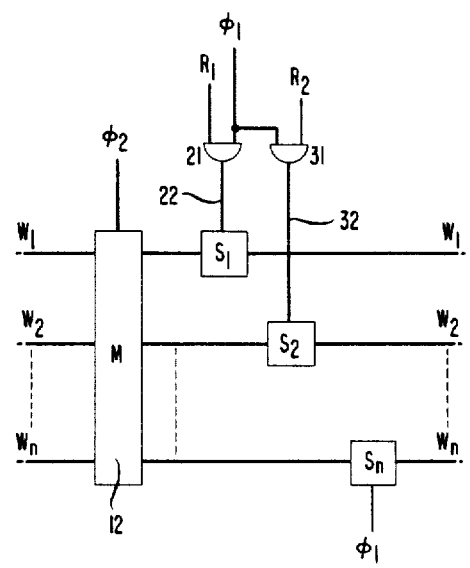
FIG. 3 is a diagram of a portion of a PLA with two-level control timing in accordance with another specific embodiment of the invention.
Figure 4:
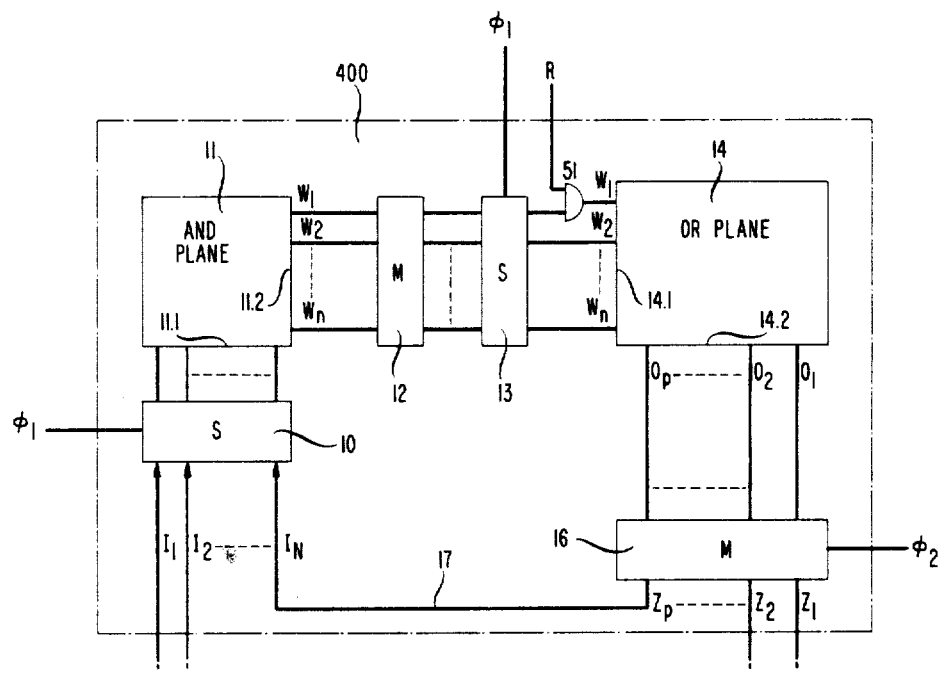
FIG. 4 is a diagram of a PLA, implementing a finite state machine, with two-level control timing in accordance with yet another specific embodiment of the invention.

As indicated in FIG. 3, different portions of the slave register (as formed by different groups of its parallel stages) connected on the wordlines $W_1, W_2, \ldots W_n$ of the otherwise identical PLA 100 can have different control timing supplied by different control lines 22, 32 . . . . For example, the control timing on control line 22 for the topmost slave register portion or stage $S_1$ can be supplied by the first clock sequence $\phi_1$ gated by the AND gate 21 with a first WAIT signal $R_1$ (which can be the same as the WAIT signal W in FIG. 1); the control timing on control line 32 for the next-to-topmost slave register portion or stage $S_2$ can be supplied by the first clock sequence $\phi_1$ gated by another AND gate 31 with a second, different WAIT signal $R_2$; and the control timing for the bottom-most slave register portion or stage $S_n$ can simply be the first clock sequence $\phi_1$ itself (ungated). In this way, the WAIT signals $R_1, R_2 \ldots$ control the flow of data from the AND plane 10 to the OR plane 14, through the master and slave registers 12 and 13, along the wordlines $W_1, W_2 \ldots$ Referring to FIG. 4, a PLA 400 includes a combinational logic device such as an AND gate 51, inserted in the path of data flowing from the slave register 13 to the input end 14.1 of the OR plane 14, in order to control the data flow from the slave register to the AND plane in response to a WAIT signal R. Elements of the PLA 400 of FIG. 4 which are similar or identical to those of the PLA 100 of FIG. 1 are denoted by the same reference numerals. The timing of the slave register 13 can be controlled directly by the first sequence ? 1 or, alternatively, by the first sequence AND gated with the WAIT signal W (or WAIT signals $R_1, R_2 \ldots$ ) as described above in connection with FIG. 1 (or FIG. 3). By thus placing the AND gate 51 (FIG. 4) in the path of data flow from the slave register 13 to the OR plane 14, the flow of data into the output register 16 is affected sooner by the WAIT signal R than would be the case where the AND gate 51 would be placed in one of the input lines $I_1, I_2, \ldots I_n$ of the input register 10. Thus, for example, if the WAIT signal is a flag signal, then the output of the PLA 400 is affected by the flag signal before the end of the same cycle at the beginning of which the flag signal goes LOW, rather than at the end of the next cycle as would be the case where the AND gate 51 would be placed on an input line of the input register 10. Accordingly, the outputs (including feedback) of the PLA 400, as well as of the PLA 100, respond to the WAIT signal during the same cycle as that during which the WAIT signal goes LOW ("unready"). Thus both the PLA 100 and the PLA 400 are characterized by same-cycle decision-making capability.

Although the invention has been described in terms of specific embodiments, various modifications can be made without departing from the scope of the invention. Instead of AND gates, NOR gates can be used whose inputs are the complements of the WAIT signal and of the clock timing sequence, whereby an overall ANDing logic function is performed.

What is claimed is:

1. A PLA comprising an AND plane, an OR plane, intermediate wordlines connected therebetween, a master register and its slave register connected on each of the wordlines for two-level timing of the PLA, and a combinational logic device connected directly to the slave register in order to control a wordline flow of data from the master register through the slave register to the OR plane in accordance with a WAIT signal applied to the combinational logic device, whereby when the WAIT signal is applied to the combinational logic device at the beginning of a given clock cycle of the two-level timing, output of the PLA can respond to the WAIT signal at or before the end of the same given cycle.

2. A PLA according to claim 1 in which the combinational logic device is connected on a wordline between the slave register and the OR plane in order to control the flow of data from the slave register to the OR plane.

3. The PLA of claim 2 in which the combinational logic device is an AND gate.

4. A PLA according to claim 1 which an output terminal of the combinational logic device is connected directly to the slave register in order to control the latching of the slave register, whereby latching of fresh wordline data from the master register by the slave register can be controlled by the WAIT signal.

5. The PLA of claim 4 in which the combinational logic device is a gate for ANDing the WAIT signal with a clock pulse sequence, whereby the latching by the slave register can be stopped by the WAIT signal.

6. The PLA of claim 1 further including a second combinational logic device connected directly to the slave register in order to control a second wordline flow of data from the master register through the slave register to the OR plane in accordance with a second WAIT signal applied to the second logic device.

7. The PLA of claim 6 in which the first and the second combinational logic devices are AND gates.

8. A PLA which implements a finite state machine comprising:

an AND plane and an OR plane interconnected by intermediate wordlines, a master register and its slave register connected to the wordlines in master-slave relationship, in order that the master register can periodically latch data from the AND plane and that the slave register can deliver data to the OR plane, and a combinational logic device connected for gating a first clock pulse sequence with a WAIT signal and for delivering latching control timing to the slave register, at least one feedback line connected for delivering data from the OR plane to the AND plane, whereby the latching control timing for the slave register is the first clock pulse sequence gated with the WAIT signal by the combinational logic device so that the state of the machine can be frozen during the same cycle of the first clock pulse sequence as that during which the WAIT signal goes to a predetermined level.

9. The PLA of claim 8 further comprising an input register connected for latching data in response to the first clock sequence and for delivering data to the AND plane, and an output register connected for latching data from the OR plane in response to a second clock pulse sequence and for delivering data to the feedback line.

10. The PLA of claim 9 in which the master register is timed to latch the data from the wordlines in response to the second clock pulse sequence.

11. The PLA of claim 10 in which the combinational logic device is an AND gate.

12. A PLA which implements a finite state machine comprising:

(a) an AND plane having an input end and an output end;

(b) an input register, connected for latching data in response to first clock pulse sequence and for delivering data to the input end of the AND plane;

(c) a master register connected for latching data from the output end of the AND plane in response to a second clock pulse sequence;

(d) a slave register connected for latching data from the master register in response to a first control timing signal;

(e) an OR plane having an input end connected for receiving data from the slave register and having an output end;

(f) an output register connected for latching data from the output end of the OR plane and for delivering at least one data signal on a feedback line to the input register in response to the second clock pulse sequence; and (g) a combinational logic device having an input terminal connected for receiving the first clock pulse sequence and another input terminal for receiving a WAIT signal, and having an output terminal connected to a control line for delivering the first control timing signal to the slave register, whereby the first control timing signal is the first clock pulse sequence gated with the WAIT signal by the combinational logic device.

13. The PLA of claim 12 in which the first and second clock pulse sequences have the same clock period.

14. The PLA of claim 13 in which the combinational logic device is an AND gate.

15. The PLA of claim 12 in which the combinational logic device is an AND gate.

16. A PLA comprising:

(a) an AND plane having an input end and an output end;

(b) an input register, connected for latching data in response to a first clock pulse sequence and for delivering data to the input end of the AND plane;

(c) a master register connected for latching data from the output end of the AND plane in response to a second clock pulse sequence;

(d) a slave register connected for receiving data from the master register;

(e) an OR plane having an input end connected for receiving data from the slave register and having an output end;

(f) an output register connected for latching data from the output end of the OR plane and for delivering at least one data signal on a feedback line to the input register in response to the second clock pulse sequence; and (g) a first combinational logic device having an input terminal connected for receiving the first clock pulse sequence and another input terminal connected for receiving a first WAIT signal, and having an output terminal connected to a first control line for delivering a first control timing signal to a first portion of the slave register, whereby timing of the latching of the first portion of the slave register is controlled by the first control timing signal.

17. The PLA of claim 16 further including a second combinational logic device having an input terminal connected for receiving the first clock pulse sequence and another input terminal connected for receiving a second WAIT signal, and having an output terminal connected to a second control line for delivering a second control timing signal to a second portion of the slave register, whereby timing of the latching of the second portion of the slave register is controlled by the second control timing signal.

18. The PLA of claim 17 in which the slave register has a third portion, the timing of the latching of which is controlled directly by the first clock pulse sequence.

19. The PLA of claim 16, 19, or 20 in which each of the first and second combinational logic devices is a separate AND gate.

* * * * *

UNITED STATES PATENT AND TRADEMARK OFFICE
CERTIFICATE OF CORRECTION

PATENT NO. : 4,488,229

DATED : December 11, 1984

INVENTOR(S) : Marc L. Harrison

It is certified that error appears in the above-identified patent and that said Letters Patent is hereby corrected as shown below:

Column 2, line 61, "reqponse" should read --response--.
Column 8, line 53, "$t_{1O}$" should read --$t_{10}$--. Column 9, line 34, "?1" should read --$\phi_1$--.

*Signed and Sealed this*

*Twentieth* Day of *August 1985*

[SEAL]

*Attest:*

DONALD J. QUIGG

*Attesting Officer*     *Acting Commissioner of Patents and Trademarks*